United States Patent
Kim et al.

(10) Patent No.: US 11,521,561 B2
(45) Date of Patent: Dec. 6, 2022

(54) DISPLAY DEVICE AND DRIVING METHOD THEREOF

(71) Applicant: Samsung Display Co., Ltd., Yongin-si (KR)

(72) Inventors: Sung Hwan Kim, Yongin-si (KR); Chul Kyu Kang, Suwon-si (KR); Hyun-Chol Bang, Seongnam-si (KR); Soo Hee Oh, Hwaseong-si (KR); Dong Sun Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/395,979

(22) Filed: Aug. 6, 2021

(65) Prior Publication Data

US 2021/0366409 A1 Nov. 25, 2021

Related U.S. Application Data

(63) Continuation of application No. 16/725,288, filed on Dec. 23, 2019, now Pat. No. 11,087,695.

(30) Foreign Application Priority Data

Dec. 31, 2018 (KR) .......................... 10-2018-0173827

(51) Int. Cl.
  *G09G 3/3291* (2016.01)
  *G09G 3/3266* (2016.01)
  *H01L 27/32* (2006.01)

(52) U.S. Cl.
  CPC ......... *G09G 3/3291* (2013.01); *G09G 3/3266* (2013.01); *G09G 2300/0469* (2013.01); *G09G 2360/145* (2013.01); *H01L 27/3244* (2013.01)

(58) Field of Classification Search
  CPC ......... G09G 2300/0426; G09G 3/3275; G09G 2310/0262; G09G 3/3258; G09G 3/3291;
  (Continued)

(56) References Cited

U.S. PATENT DOCUMENTS

2007/0103405 A1   5/2007   Kwak et al.
2014/0132158 A1   5/2014   Land et al.
(Continued)

FOREIGN PATENT DOCUMENTS

EP   2 806 421    11/2014
JP   2010-509804   3/2010
(Continued)

OTHER PUBLICATIONS

Extended European Search Report corresponding to European Application or Patent No. 19219275.5 dated May 18, 2020.

*Primary Examiner* — Gerald Johnson
(74) *Attorney, Agent, or Firm* — Tle Park Reed & Houtteman PLLC

(57) ABSTRACT

A display device includes: scan, control, and emission control signal lines, signals transmitted thereby being different from one another; data and driving voltage lines; a first transistor including a first gate electrode and first source and drain; a second transistor including a second gate electrode connected to a first scan line, a second source connected to a first data line, and a second drain connected to the first source; a light-emitting element; a control transistor including a control gate electrode connected to a first control line and between the driving voltage line and the first source or the light-emitting element and the first drain; and an emission control transistor in series between the light-emitting element and the control transistor, the control transistor and the first transistor, or the driving voltage line and the control transistor, and an emission control gate electrode connected to the emission control signal line.

12 Claims, 16 Drawing Sheets

(58) Field of Classification Search
CPC ......... G09G 3/3225; G09G 2310/0267; G09G 2300/0439; G02F 1/1339; G02F 1/133317; H01L 27/3276
See application file for complete search history.

(56) References Cited

U.S. PATENT DOCUMENTS

| | | |
|---|---|---|
| 2014/0347347 A1 | 11/2014 | Jeong et al. |
| 2016/0133209 A1* | 5/2016 | Lee .................. G02F 1/133617 345/698 |
| 2017/0061876 A1 | 3/2017 | Cho et al. |
| 2017/0110054 A1* | 4/2017 | Sun ...................... G09G 3/3291 |
| 2017/0162111 A1 | 6/2017 | Kang et al. |
| 2017/0249896 A1* | 8/2017 | Kim ...................... G09G 3/3225 |
| 2017/0301280 A1* | 10/2017 | Ka ...................... H01L 27/3223 |
| 2018/0348959 A1 | 12/2018 | Lin et al. |
| 2019/0393286 A1 | 12/2019 | Ding et al. |
| 2020/0117034 A1* | 4/2020 | Yin ...................... G02F 1/1339 |

FOREIGN PATENT DOCUMENTS

| | | |
|---|---|---|
| KR | 10-0868642 | 11/2008 |
| KR | 10-2016-0099770 | 8/2016 |
| KR | 10-2017-0111827 | 10/2017 |
| KR | 10-2018-0005588 | 1/2018 |
| KR | 10-1859105 | 5/2018 |

* cited by examiner

DISPLAY DEVICE AND DRIVING METHOD THEREOF

CROSS-REFERENCE TO RELATED APPLICATION(S)

This is a continuation application of U.S. patent application Ser. No. 16/725,288, filed Dec. 23, 2019 (now pending), the disclosure of which is incorporated herein by reference in its entirety. U.S. patent application Ser. No. 16/725,288 claims priority to and benefit of Korean Patent Application No. 10-2018-0173827 under 35 U.S.C. § 119, filed on Dec. 31, 2018 in the Korean Intellectual Property Office, the entire contents of which are incorporated herein by reference.

BACKGROUND

1. Field

The present disclosure relates to a display device and a driving method thereof.

2. Description of the Related Art

Display devices, such as a liquid crystal display (LCD) or an organic light emitting diode (OLED display, include a display panel including a plurality of pixels for displaying images. The respective pixels may include a pixel electrode for receiving a data signal, and the pixel electrode may be connected to at least one transistor and may receive the data signal. Recently, various display devices having functions in addition to image displaying have been under development.

SUMMARY

An exemplary embodiment provides a display device including: scan lines for transmitting a scan signal; control lines for transmitting a control signal that is different from the scan signal; emission control signal lines for transmitting an emission control signal that is different from the control signal; data lines and driving voltage lines traversing the scan lines and the control lines; a first transistor including a first gate electrode, a first channel region, a first source region, and a first drain region; a second transistor including a second gate electrode connected to a first scan line among the plurality of scan lines, a second source region connected to a first data line among the data lines, and a second drain region connected to the first source region; a light-emitting element; a control transistor including a control gate electrode connected to a first control line among the control lines, and connected between the driving voltage line and the first source region or between the light-emitting element and the first drain region; and an emission control transistor coupled in series between the light-emitting element and the control transistor, or between the control transistor and the first transistor, or between the driving voltage line and the control transistor, and including an emission control gate electrode connected to the emission control signal line.

The control transistor may include a third source region connected to the first drain region, and a third transistor including a third drain region, and the emission control transistor may include an emission control source region connected to the third drain region, and an emission control drain region connected to the light-emitting element.

The control transistor may further include a fourth transistor including a fourth source region connected to the driving voltage line, and a fourth drain region connected to the first source region.

The control transistor may include a third transistor including a third drain region connected to the light-emitting element, and a third source region, and the emission control transistor may include an emission control drain region connected to the third source region, and an emission control source region connected to the first drain region.

The control transistor may further include a fourth transistor including a fourth source region connected to the driving voltage line, and a fourth drain region connected to the first source region.

The control transistor may include a third drain region connected to the first source region, and a third transistor including a third source region, and the emission control transistor may include an emission control drain region connected to the third source region, and an emission control drain region connected to the driving voltage line.

The control transistor may further include a fourth transistor including a fourth drain region connected to the light-emitting element, and a fourth source region connected to the first drain region.

The display device may further include: a third transistor including a third gate electrode connected to the first scan line, a third drain region connected to the first gate electrode, and a third source region connected to the first drain region; and a capacitor including a first terminal connected to the first gate electrode, and a second terminal connected to the driving voltage line.

The display device may further include a vertical control signal line traversing the emission control signal line and electrically connected to the emission control signal line.

Another embodiment provides a display device including: a display area including a first display area including a plurality of first pixels and a second display area including a plurality of second pixels; a plurality of scan lines provided in the first and second display areas and for transmitting a scan signal; a plurality of control lines provided in the first and second display areas and for transmitting a control signal that is different from the scan signal; a plurality of emission control signal lines provided in the second display area and for transmitting an emission control signal that is different from the control signal; and a plurality of data lines and a plurality of driving voltage lines provided in the first and second display areas and traversing the plurality of scan lines and the plurality of control lines, wherein each of the first pixel and the second pixel includes a plurality of transistors and a light-emitting element that are connected to the scan line, the control line, the data line, and the driving voltage line, and the second pixel further includes an emission control transistor connected to the emission control signal line.

The display device may further include: a peripheral area provided outside the display area; and a signal wire provided in the peripheral area, electrically connected to the plurality of emission control signal lines, and for transmitting the emission control signal.

The display device may further include a vertical control signal line provided in the second display area, traversing the emission control signal line, and electrically connected to the emission control signal line.

The display device may further include a peripheral control signal line provided around the second display area and electrically connected to the emission control signal line and the vertical control signal line.

A pitch in a first direction of the plurality of second pixels in the second display area may be greater than a pitch in the first direction of the plurality of first pixels in the first display area.

The plurality of scan lines, the plurality of control lines, and the plurality of emission control signal lines may be provided in a same conductive layer.

The plurality of transistors may include: a first transistor including a first gate electrode, a first channel region, a first source region, and a first drain region; a second transistor including a second gate electrode connected to a first scan line among the plurality of scan lines, a second source region connected to a first data line among the plurality of data lines, and a second drain region connected to the first source region; and a control transistor including a control gate electrode connected to a first control line among the plurality of control lines, and connected between the driving voltage line and the first source region, or between the light-emitting element and the first drain region, and the emission control transistor may be coupled in series between the light-emitting element and the control transistor, or between the control transistor and the first transistor, or between the driving voltage line and the control transistor, and may include an emission control gate electrode connected to the emission control signal line.

The display device may further include an optical element overlapping the second display area, wherein the optical element may include a camera or a sensor.

Yet another embodiment provides a method for driving a display device in a display device including a plurality of scan lines, a plurality of control lines, a plurality of emission control signal lines, a plurality of transistors connected to the scan lines and the control lines, an emission control transistor connected to the emission control signal lines, and a light-emitting element, including: sequentially transmitting a scan signal to the scan lines; sequentially transmitting a control signal to the control lines; and simultaneously transmitting an emission control signal that is different from the control signal to the plurality of emission control signal lines.

The display device may further include a first display area, a second display area, and an optical element overlapping the second display area, the second display area may include the emission control transistor, and the emission control transistor may be turned off by the emission control signal for a period in which the optical element is operated.

At least one period in which the emission control transistor is turned off may be provided for one frame in which the scan signal is sequentially transmitted to the plurality of scan lines.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
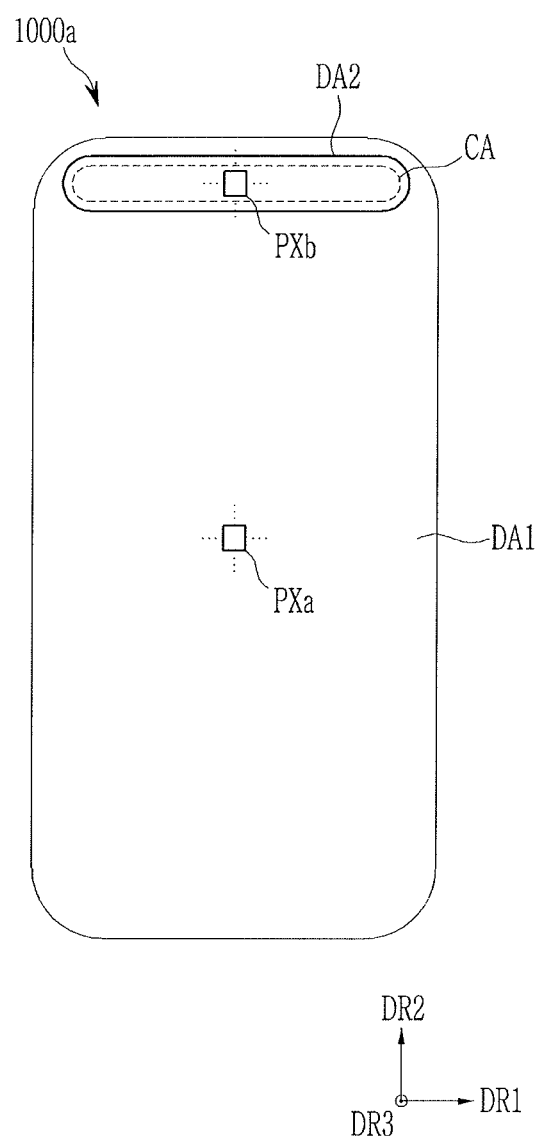
FIG. 1, FIG. 2, and FIG. 3 illustrate layout views of a display area of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The drawings and description are to be regarded as illustrative in nature and not restrictive. Like reference numerals designate like elements throughout the specification.

The size and thickness of each component illustrated in the drawings are arbitrarily illustrated for better understanding and ease of description. The thickness of layers, films, panels, regions, etc., is exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

Throughout the specification, a plane view represents a view for observing a side that is parallel to two directions (e.g., a first direction (DR1) and a second direction (DR2)) crossing each other, and a cross-sectional view represents a view for observing a side that is cut in a direction (e.g., a third direction (DR3)) that is perpendicular to a side that is parallel to the first direction (DR1) and the second direction (DR2). Further, when two constituent elements overlap each other, it means that the two constituent elements overlap each other in the third direction (DR3), for example, in the direction that is perpendicular to an upper side of a substrate.

Figure 2:
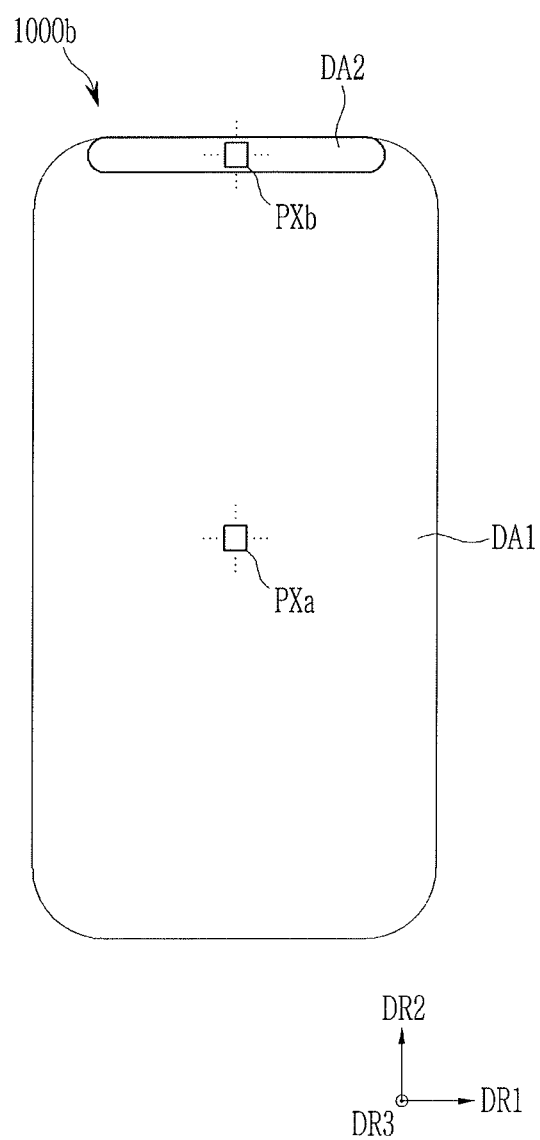
Figure 3:
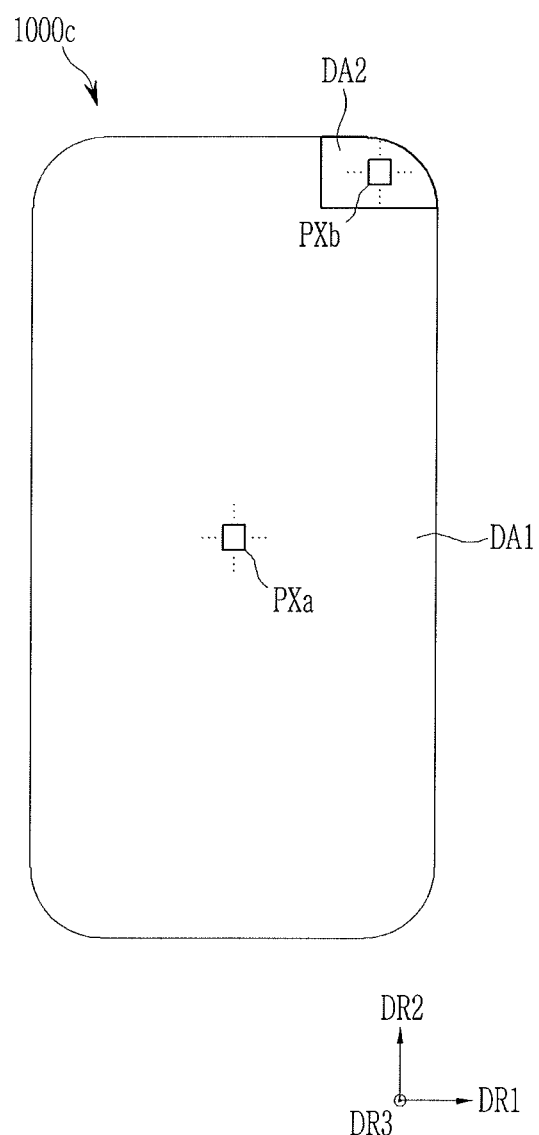
Figure 4:
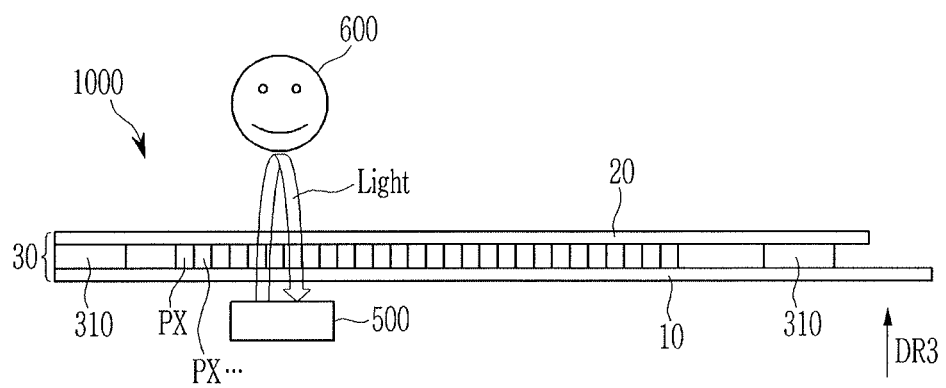
FIG. 4 illustrates a cross-sectional view of a display device according to an exemplary embodiment.

A configuration of a display device according to an exemplary embodiment will now be described with reference to FIG. 1 through FIG. 4. FIG. 1, FIG. 2, and FIG. 3 show layout views of a display area of a display device according to an exemplary embodiment. FIG. 4 shows a cross-sectional view of a display device according to an exemplary embodiment.

Referring to FIG. 1 through FIG. 4, a display area included by display devices 1000a, 1000b, 1000c, and 1000, respectively, according to an exemplary embodiment is a region for displaying an image, and it may include a first display area DA1 and a second display area DA2 for displaying an image and for performing other functions. Referring to FIG. 4, the display device 1000 may include a display panel 30 and an optical element 500. The optical element 500 may be provided on a rear side of the display panel 30, but its position is not limited thereto.

The first display area DA1 may include a plurality of first pixels (PXa) and the second display area DA2 may include a plurality of second pixels (PXb). The pixels PXa and PXb may respectively include a circuit for driving a pixel emitting region that is a region for emitting light based on an input image signal and a region in which the circuit is formed.

Referring to FIG. 1, the second display area DA2 may be surrounded by the first display area DA1 and may be near one side of the display device 1000a in a plane view. In a plane view, the first display area DA1 may be provided between the second display area DA2 and an edge of the display device 1000a. For example, the second display area DA2 may be provided near an upper end of the display device 1000a and may extend in a first direction DR1 along most of an upper edge of the display device 1000a, e.g., the first display area DA1 may completely surround the second display area DA2.

Referring to FIG. 2, the second display area DA2 according to the present exemplary embodiment mostly corresponds to the exemplary embodiment described with reference to FIG. 1, except that the first display area DA1 may not be provided around at least one side of the second display area DA2. That is, in a plane view, one edge of the second display area DA2 may substantially correspond to one edge of the display device 1000b. For example, when the second display area DA2 is provided near an upper edge of the display device 1000b, the first display area DA1 may not be provided on a top side of the second display area DA2, e.g., the first display DA1 area may only be on three sides of the second display area DA2.

Referring to FIG. 3, the second display area DA2 according to the present exemplary embodiment mostly corresponds to the exemplary embodiment described with reference to FIG. 2, except that the second display area DA2 may be provided on a corner edge of the display device 1000c or around the corner edge thereof. In a plane view, one edge of the second display area DA2 may correspond to one corner edge of the display device 1000c. For example, when the second display area DA2 is provided around an upper corner of the display device 1000c, one edge of the second display area DA2 may correspond to an edge of one corner of an upper side of the first display area DA1, e.g., the first display area DA1 may only be on three sides of the second display area DA2.

In addition, the second display area DA2 may be provided on various positions in the display area of the display device and may have various planar forms. For example, the second display area DA2 may have a circular planar form provided near an upper edge of the display device, an arbitrary form provided around the center of the upper edge of the display device of the second display area DA2, and so forth.

Referring to FIG. 4, the display panel 30 included by the display device 1000 may include a substrate 10 and an encapsulation substrate 20 provided in the first display area DA1 and the second display area DA2. The substrate 10 may be continuously formed in the second display area DA2, i.e., may not have a removed portion.

A plurality of pixels PX may be formed between the substrate 10 and the encapsulation substrate 20. The plurality of pixels PX may include the above-described first pixels (PXa) and second pixels (PXb). A sealant 310 provided between the substrate 10 and the encapsulation substrate 20 may be provided on the edge of the display panel 30.

The optical element 500 may be provided below the display panel 30. The optical element 500 may be various kinds of optical elements, e.g., a camera, a flash, a sensor, and so forth. The optical element 500 may output and/or receive light in a specific wavelength range, e.g., visible, infrared, ultraviolet, and so forth, and may sense an image of an external object.

For example, the optical element 500 may output light in a predetermined wavelength range toward an object 600 provided on the display panel 30 and/or may receive light reflected from the object 600. The light with a predetermined wavelength is light with a wavelength that may be processed by the optical element 500 and may be light outside a visible region of the image displayed by the pixel PX or may be light in the visible region. For example, when the optical element 500 is an infrared camera, light with a predetermined wavelength may be substantially 900 nm to 1000 nm, and so forth.

The optical element 500 may overlap the second display area DA2, and light output by the optical element 500 or input to the optical element 500 may pass through the second display area DA2 of the display panel 30. The optical element region (CA) including the optical element 500 may have an area that corresponds to the whole second display area DA2 in a plane view or may have an area that corresponds to part of the second display area DA2.

A pixel of a display device according to an exemplary embodiment will now be described with reference to FIG. 5 through FIG. 8, together with the above-shown drawings.

Figure 5:
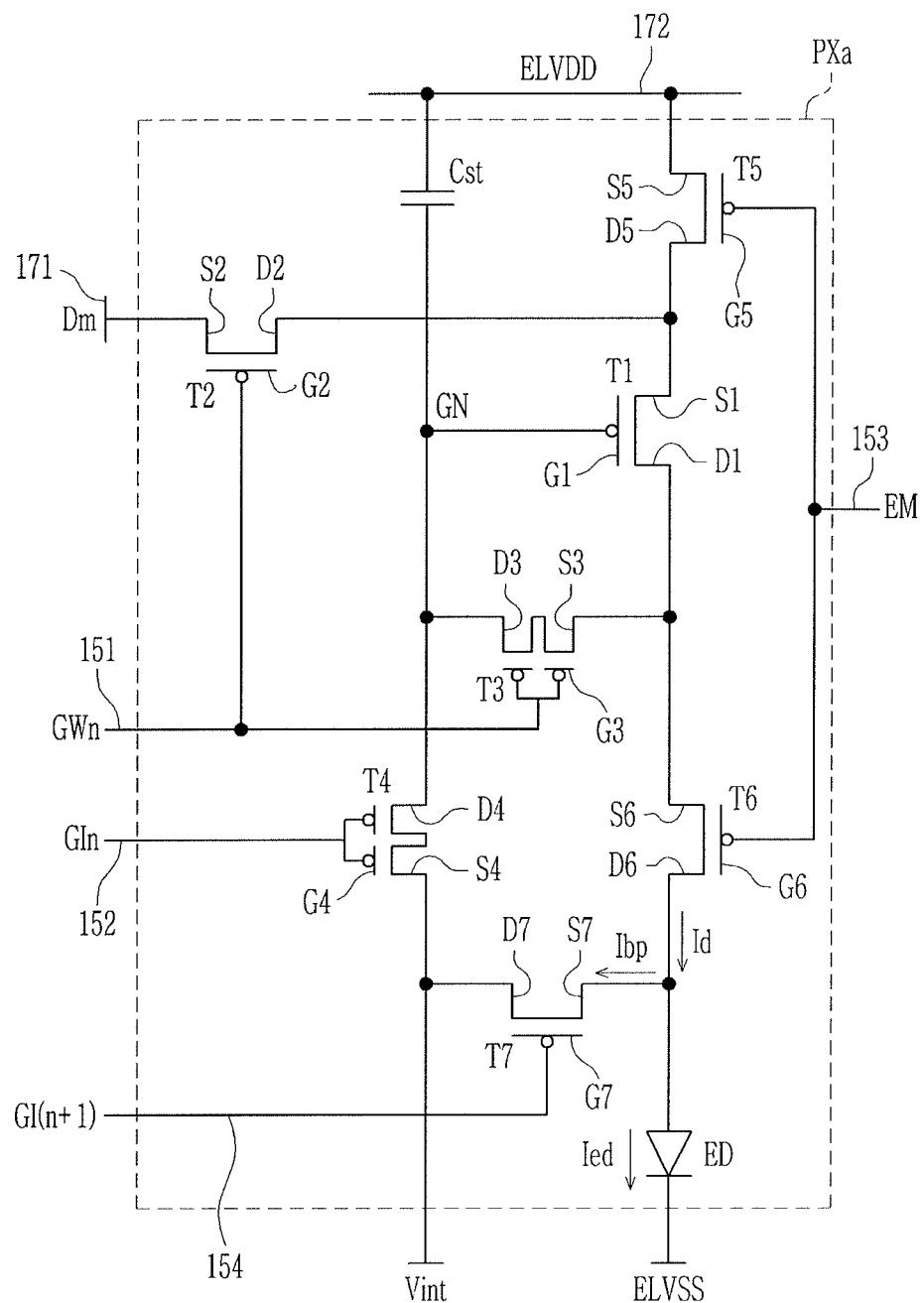
FIG. 5, FIG. 6, FIG. 7, and FIG. 8 illustrate circuit diagrams on one pixel of a display device according to an exemplary embodiment.
Figure 6:
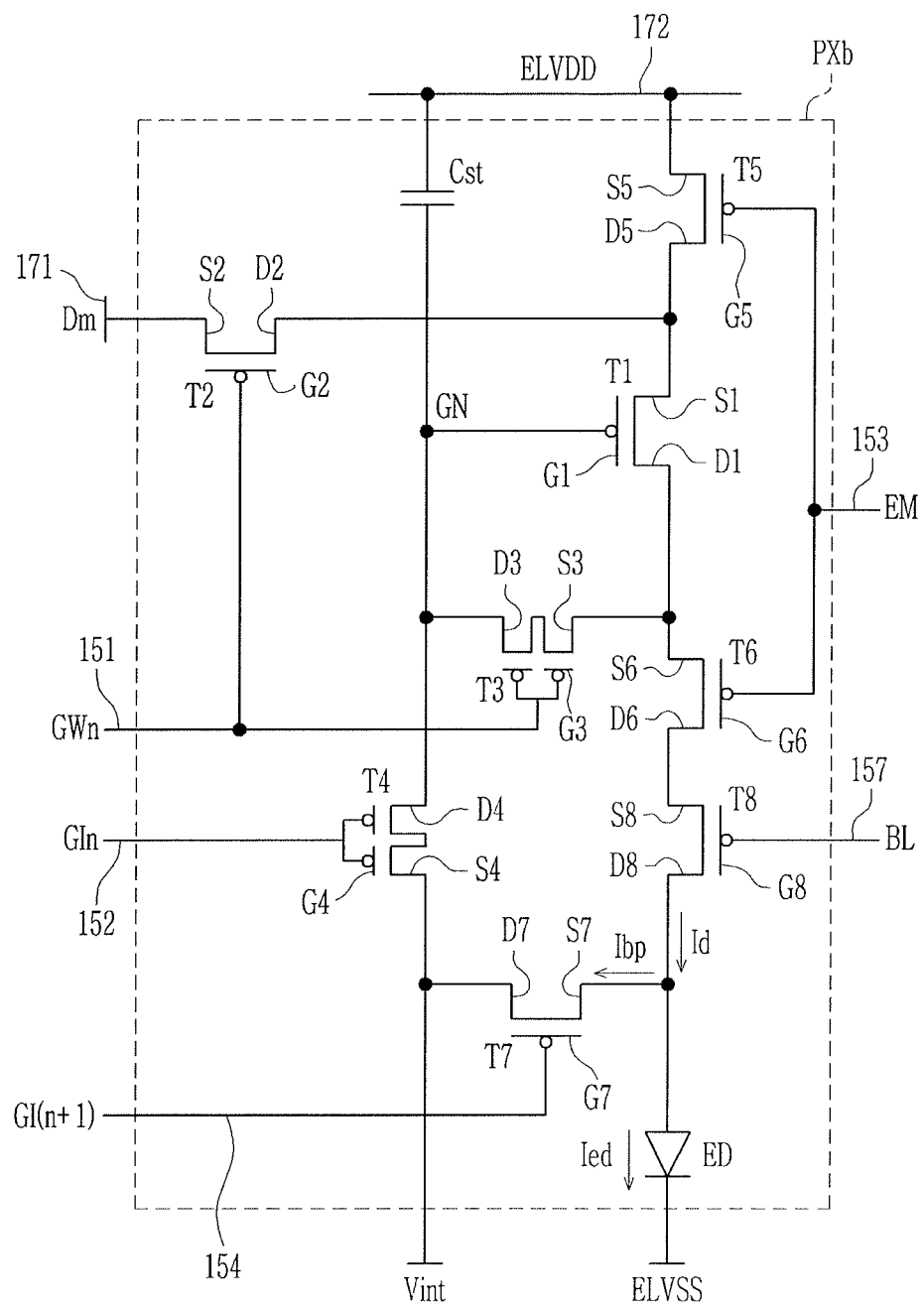
Figure 7:
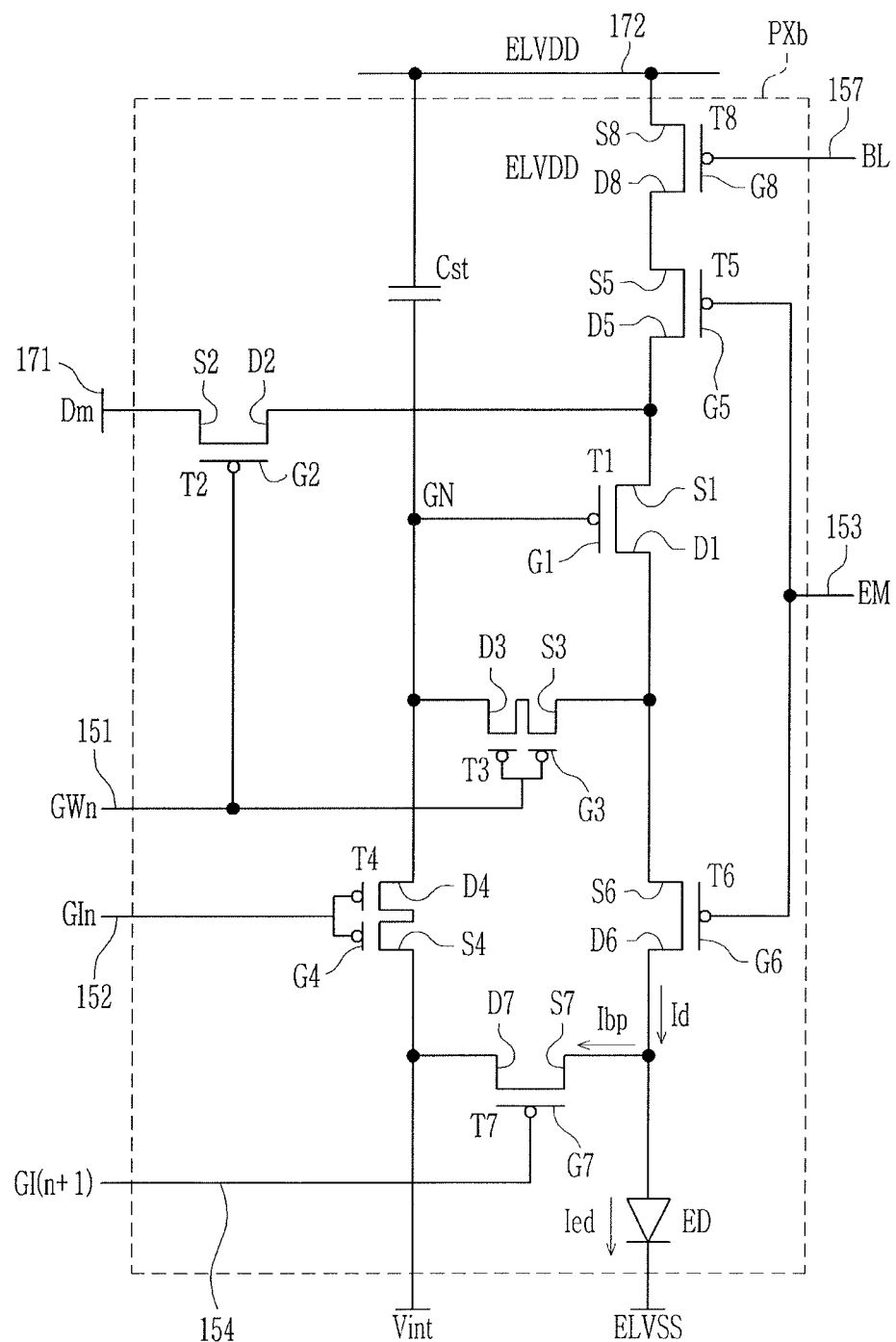
Figure 8:
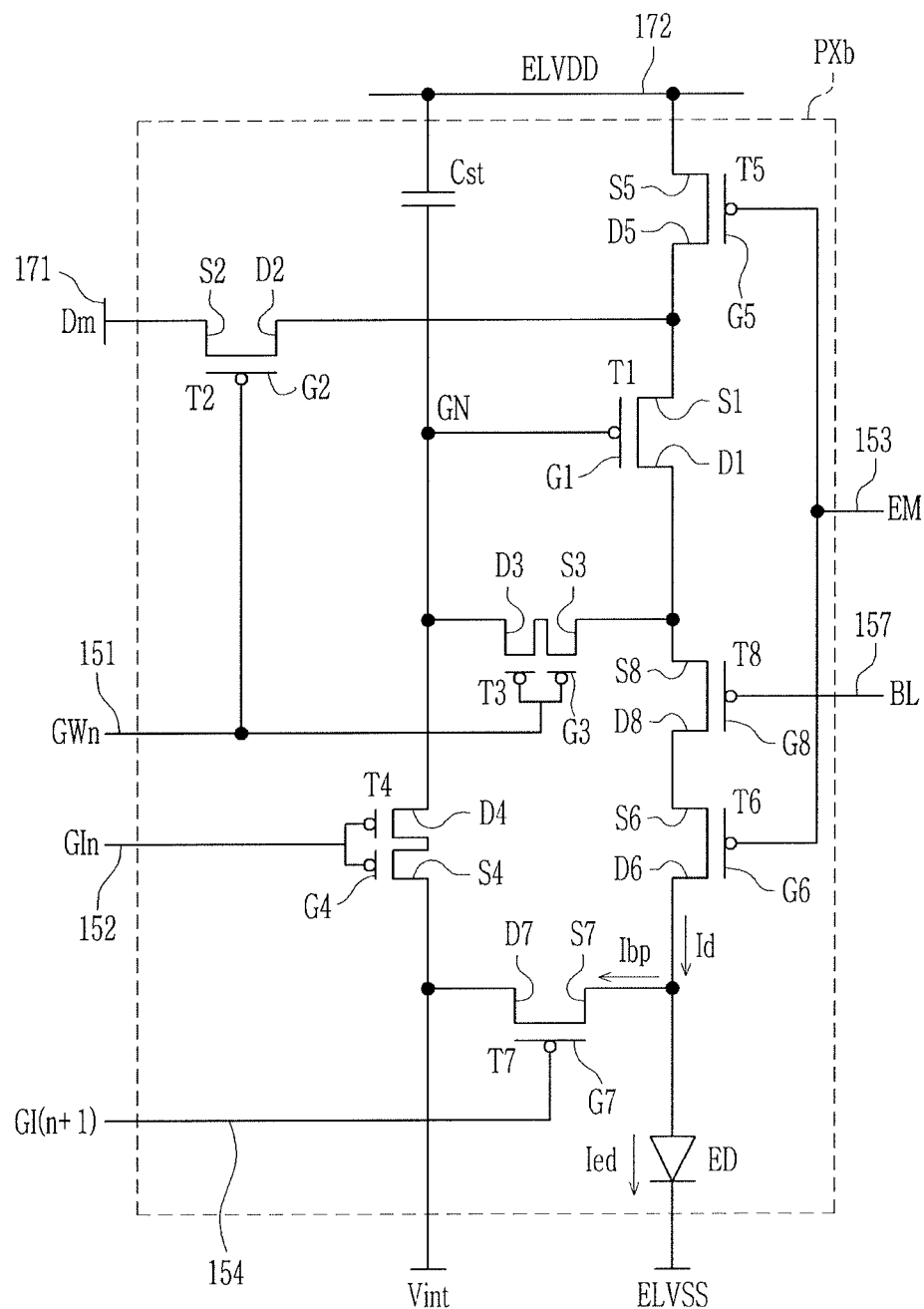

FIG. 5 shows a circuit diagram of one first pixel (PXa) in a first display area DA1 of a display device according to an exemplary embodiment. FIG. 6, FIG. 7, and FIG. 8 show circuit diagrams on one second pixel (PXb) in a second display area DA2 of a display device according to an exemplary embodiment.

Referring to FIG. 5, one first pixel (PXa) in the first display area DA1 may include a plurality of transistors T1, T2, T3, T4, T5, T6, and T7 connected to a plurality of signal lines 151, 152, 153, 154, 171, and 172, a capacitor Cst, and at least one light emitting diode (ED) that is a light-emitting element. In the present exemplary embodiment, a case in which one first pixel (PXa) includes one light emitting diode (ED) will be described.

The signal lines 151, 152, 153, 154, 171, and 172 may include a plurality of scan lines 151, 152, and 154, a control line 153, a data line 171, and a driving voltage line 172.

The plurality of scan lines 151, 152, and 154 may transmit scan signals GWn, GIn, and GI(n+1), respectively. The scan signals GWn, GIn, and GI(n+1) may transmit a gate-on voltage and a gate-off voltage for turning on/off the transistors T2, T3, T4, and T7 included by the first pixel (PXa).

The scan lines 151, 152, and 154 connected to one first pixel (PXa) may include a scan line 151 for transmitting a scan signal (GWn), a scan line 152 for transmitting a scan signal (GIn) with a gate-on voltage with timing differing from the timing of the scan line 151, and a scan line 154 for transmitting a scan signal (GI(n+1)). The scan line 152 may transmit a gate-on voltage with timing prior to the timing of the scan line 151. For example, when the scan signal (GWn) is the n-th scan signal (Sn) (n is a natural number that is equal to or greater than 1) among the scan signals applied for one frame, the scan signal (GIn) may be a previous-stage scan signal such as the (n−1)-th scan signal (S(n−1)), and the scan signal (GI(n+1)) may be the n-th scan signal (Sn). In an implementation, the scan signal (GI(n+1)) may be a scan signal that is different from the n-th scan signal (Sn).

The control line 153 may transmit a control signal for controlling emission of the light emitting diode (ED). The control signal may transmit a gate-on voltage and a gate-off voltage.

The data line 171 may transmit a data signal (Dm), and the driving voltage line 172 may transmit a driving voltage (ELVDD). The data signal (Dm) may have different voltage levels according to an image signal input to the display device, and the driving voltage (ELVDD) may substantially have a constant level.

A plurality of transistors T1, T2, T3, T4, T5, T6, and T7 included by one first pixel (PXa) may include a first transistor T1, a second transistor T2, a third transistor T3, a fourth transistor T4, a fifth transistor T5, a sixth transistor T6, and a seventh transistor T7.

The scan line 151 may transmit a scan signal (GWn) to the second transistor T2 and the third transistor T3, the scan line 152 may transmit a scan signal (GIn) to the fourth transistor T4, the scan line 154 may transmit a scan signal (GI(n+1)) to the seventh transistor T7, and the control line 153 may transmit a control signal (EM) to the fifth transistor T5 and the sixth transistor T6.

The first transistor T1 includes a gate electrode G1 connected to a first end of the capacitor Cst through a driving gate node (GN), a source electrode S1 connected to a driving voltage line 172 through the fifth transistor T5, and a drain electrode D1 connected to an anode of the light emitting diode (ED) through the sixth transistor T6. The first transistor T1 may receive the data signal (Dm) transmitted by the data line 171 and may supply a driving current (Id) to the light emitting diode (ED) according to a switching operation of the second transistor T2.

The second transistor T2 includes a gate electrode G2 connected to the scan line 151, a source electrode S2 connected to the data line 171, and a drain electrode D2 connected to the source electrode S1 of the first transistor T1 and connected to the driving voltage line 172 through the fifth transistor T5. The second transistor T2 may be turned on by the scan signal (GWn) transmitted through the scan line 151 and may transmit the data signal (Dm) transmitted by the data line 171 to the source electrode S1 of the first transistor T1.

The third transistor T3 includes a gate electrode G3 connected to the scan line 151, a source electrode S3 connected to the drain electrode D1 of the first transistor T1 and connected to the anode of the light emitting diode (ED) through the sixth transistor T6, and a drain electrode D3 connected to a drain electrode D4 of the fourth transistor T4, a first end of the capacitor Cst, and the gate electrode G1 of the first transistor T1. The third transistor T3 may be turned on according to the scan signal (GWn) transmitted through the scan line 151 and may connect the gate electrode G1 and the drain electrode D1 of the first transistor T1 to diode-connect the first transistor T1.

The fourth transistor T4 includes a gate electrode G4 connected to the scan line 152, a source electrode S4 connected to an initialization voltage (Vint) terminal, and a drain electrode D4 connected to the first end of the capacitor Cst and the gate electrode G1 of the first transistor T1 through the drain electrode D3 of the third transistor T3. The fourth transistor T4 may be turned on according to the scan signal (GIn) transmitted through the scan line 152 and may transmit the initialization voltage (Vint) to the gate electrode G1 of the first transistor T1 to thus perform an initialization operation for initializing the voltage at the gate electrode G1 of the first transistor T1.

The fifth transistor T5 includes a gate electrode G5 connected to the control line 153, a source electrode S5 connected to the driving voltage line 172, and a drain electrode D5 connected to the source electrode S1 of the first transistor T1 and the drain electrode D2 of the second transistor T2.

The sixth transistor T6 includes a gate electrode G6 connected to the control line 153, a source electrode S6 connected to the drain electrode D1 of the first transistor T1 and the source electrode S3 of the third transistor T3, and a drain electrode D6 electrically connected to the anode of the light emitting diode (ED). The fifth transistor T5 and the sixth transistor T6 are simultaneously turned on according to the control signal (EM) received through the control line 153, through which the driving voltage (ELVDD) may be compensated through the diode-connected first transistor T1 and may be transmitted to the light emitting diode (ED).

The fifth transistor T5 and the sixth transistor T6 are referred to as control transistors, the gate electrode of the fifth transistor T5 or the sixth transistor T6 is referred to as a control gate electrode, the source electrode of the fifth transistor T5 or the sixth transistor T6 is referred to as a control source electrode, and the drain electrode of the fifth transistor T5 or the sixth transistor T6 is referred to as a control drain electrode.

The seventh transistor T7 includes a gate electrode G7 connected to the scan line 154, a source electrode S7 connected to a drain electrode D6 of the sixth transistor T6 and the anode of the light emitting diode (ED), and a drain electrode D7 connected to the initialization voltage (Vint) terminal and the source electrode S4 of the fourth transistor T4.

The source electrodes and the drain electrodes of the transistors T1, T2, T3, T4, T5, T6, and T7 may become source regions and drain regions to be described. The transistors T1, T2, T3, T4, T5, T6, and T7 may be p-type channel transistors such as PMOS transistors. In other implementations, at least one thereof may be an n-type channel transistor.

The capacitor Cst includes a first end connected to the gate electrode G1 of the first transistor T1 and a second end connected to the driving voltage line 172. A cathode of the light emitting diode (ED) may be connected to a common voltage (ELVSS) terminal for transmitting a common voltage (ELVSS) and may receive the common voltage (ELVSS).

A configuration of the first pixel (PXa) according to an exemplary embodiment may have varying numbers of transistors and capacitors.

Referring to FIG. 6 through FIG. 8, one second pixel (PXb) provided in the second display area DA2 of the display device according to an exemplary embodiment mostly corresponds in configuration to the first pixel (PXa) shown with reference to FIG. 5, but may further include an eighth transistor T8 that is an emission control transistor and an emission control signal line 157.

The eighth transistor T8 may be coupled in series between the light emitting diode (ED) and the sixth transistor T6 that is a control transistor, between the sixth transistor T6 that is a control transistor and the first transistor T1, between the driving voltage line 172 and the fifth transistor T5 that is a control transistor, or between the fifth transistor T5 that is a control transistor and the first transistor T1, and may control emission of the second pixel (PXb).

The emission control signal line 157 may transmit an emission control signal (BL) for controlling turn-on/turn-off of the eighth transistor T8. The emission control signal (BL) may transmit a gate-on voltage and a gate-off voltage. The eighth transistor T8 includes a gate electrode G8 connected to the emission control signal line 157. The gate electrode G8 is also referred to as an emission control gate electrode.

For example, in detail, referring to FIG. 6, the eighth transistor T8 includes a gate electrode G8 connected to the emission control signal line 157, a source electrode S8 connected to the drain electrode D6 of the sixth transistor T6, and a drain electrode D8 electrically connected to the anode of the light emitting diode (ED). The source electrode S8 of the eighth transistor T8 is referred to as an emission control source electrode, and the drain electrode D8 is referred to as an emission control drain electrode. The eighth transistor T8 may be turned on or turned off according to the emission control signal (BL) transmitted through the emission control signal line 157.

When the eighth transistor T8 is turned on, the driving current (Id) may be transmitted to the light emitting diode (ED), and the light emitting diode (ED) may emit light and the second pixel (PXb) may display the image. When the eighth transistor T8 is turned off, the driving current (Id) is not transmitted to the light emitting diode (ED), the light emitting diode (ED) does not emit light, and the second pixel (PXb) does not display the image.

Referring to FIG. 7, another example of one second pixel (PXb) provided in the second display area DA2 mostly corresponds to the second pixel (PXb) described with reference to FIG. 6, except that a position of the eighth transistor T8 for controlling emission of a plurality of pixels (PXb) provided in the second display area DA2 may be different. In detail, the eighth transistor T8 may be connected to the driving voltage line 172 and the fifth transistor T5.

The gate electrode G8 of the eighth transistor T8 is connected to the emission control signal line 157, the source electrode S8 of the eighth transistor T8 is connected to the driving voltage line 172, and the drain electrode D8 of the eighth transistor T8 is connected to the source electrode S5 of the fifth transistor T5.

In the present exemplary embodiment, when the eighth transistor T8 is turned on, the driving current (Id) is transmitted to the light emitting diode (ED), the light emitting diode (ED) emits light, and the second pixel (PXb) may display the image. When the eighth transistor T8 is turned off, the driving voltage (ELVDD) is not applied to the first transistor T1, so the light emitting diode (ED) emits no light, and the pixel (PXb) may not display the image.

Differing from the exemplary embodiment described with reference to FIG. 7, the eighth transistor T8 may be connected between the drain electrode D5 of the fifth transistor T5 and the source electrode S1 of the first transistor T1.

Referring to FIG. 8, another example of one second pixel (PXb) provided in the second display area DA2 mostly corresponds to the second pixel (PXb) described with reference to FIG. 6, except the position of the eighth transistor T8 for controlling emission of the light emitting diode (ED) may be different. In detail, the eighth transistor T8 may be connected to the first transistor T1 and the sixth transistor T6.

The gate electrode G8 of the eighth transistor T8 is connected to the emission control signal line 157, the source electrode S8 of the eighth transistor T8 is connected to the drain electrode D1 of the first transistor T1, and the drain electrode D8 of the eighth transistor T8 is connected to the source electrode S5 of the sixth transistor T6.

In the present exemplary embodiment, when the eighth transistor T8 is turned on, the driving current (Id) is transmitted to the light emitting diode (ED), the light emitting diode (ED) emits light, and the second pixel (PXb) may display the image. When the eighth transistor T8 is turned off, the driving current (Id) is not transmitted to the light emitting diode (ED), the light emitting diode (ED) emits no light, and the second pixel (PXb) may not display the image.

Operations of a first pixel (PXa) of a first display area DA1 and a second pixel (PXb) of a second display area DA2 of a display device according to an exemplary embodiment will now be described with reference to FIG. 5 through FIG. 8, FIG. 9, and FIG. 10.

Figure 9:
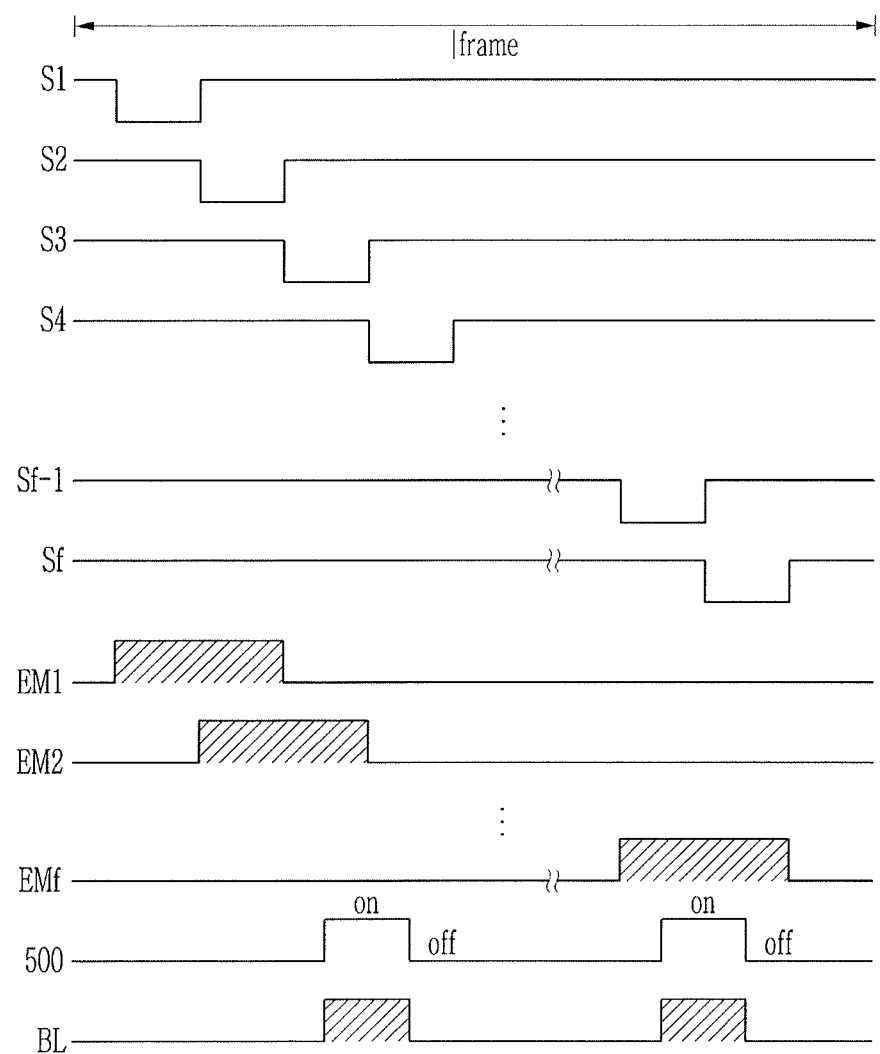
FIG. 9 and FIG. 10 illustrate waveform diagrams of a driving signal of a display device according to an exemplary embodiment.
Figure 10:
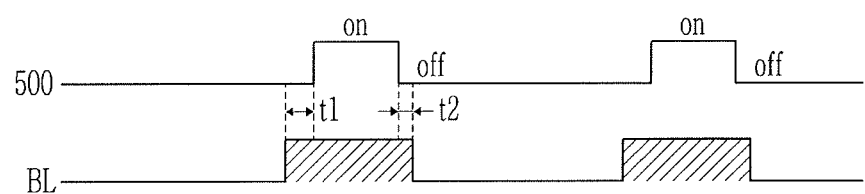

FIG. 9 and FIG. 10 show waveform diagrams of a driving signal of a display device according to an exemplary embodiment. Here, the case in which the transistors T1, T2, T3, T4, T5, T6, T7, and T8 are p-type channel transistors such as PMOS transistors is shown.

Scan signals (S1, S2, . . . , and Sf) may be sequentially scanned and applied to a plurality of scan lines 151, 152, and 154 of a display device according to an exemplary embodiment for one frame, and the control signals (EM1, EM2, . . . , and EMf) may be sequentially scanned and applied to a plurality of control lines 153 for one frame. Here, a scanning direction of the scan signal and the control signal may be the second direction DR2 shown in FIG. 1 through FIG. 3, or an opposite direction thereof. The n-th control signal (EMn) may become a low level after the n-th scan signal (Sn) becomes a high level, and it may be at a high level while the (n−1)-th scan signal (S(n−1)) is at the low level.

With reference to one first pixel (PXa), when a scan signal (GIn) at a gate-on voltage level is supplied through a scan line 152 for an initialization period (here, the scan signal (GIn) may be the (n−1)-th scan signal (S(n−1)), the fourth transistor T4 is turned on, an initialization voltage (Vint) is transmitted to the gate electrode G1 of the first transistor T1 through the fourth transistor T4, and the first transistor T1 is initialized by the initialization voltage (Vint).

When a scan signal (GWn) at a gate-on voltage level is supplied through a scan line 151 for a data programming and compensation period (here, the scan signal (GWn) may be the n-th scan signal (Sn)), the second transistor T2 and the third transistor T3 are turned on. The first transistor T1 is diode-connected by the turned-on third transistor T3 and is biased in a forward direction. A compensation voltage that is reduced from the data signal (Dm) supplied from the data line 171 by a threshold voltage of the first transistor T1 is applied to the gate electrode G1 of the first transistor T1. A driving voltage (ELVDD) and the compensation voltage are applied to respective ends of a capacitor Cst, and the capacitor Cst may store charges corresponding to a voltage difference between the respective ends.

For an emission period, when the control signal (EM) supplied by the control line 153 is changed to the gate-on voltage level from the gate-off voltage level, the fifth transistor T5 and the sixth transistor T6 are turned on, a driving current (Id) caused by a voltage difference between the gate voltage at the gate electrode G1 of the first transistor T1 and the driving voltage (ELVDD) is generated, and the driving current (Id) is supplied to the light emitting diode (ED) through the sixth transistor T6, so a current (Ied) flows to the light emitting diode (ED).

For the initialization period, the seventh transistor T7 receives the scan signal (GI(n+1)) at the gate-on voltage level through the scan line 154 and is then turned on. The scan signal (GI(n+1)) may be the n-th scan signal (Sn). A portion of the driving current (Id) may be output through the seventh transistor T7 as a bypass current (Ibp) by the turned-on seventh transistor T7.

While the control signals EM1, EM2, . . . , and EMf are at the high level, light emitting diodes (ED) of the pixels PXa and PXb may not emit light. As shown in FIG. 9, when the control signals EM1, EM2, . . . , and EMf are scanned and applied in the display area, there may be a period in which pixel rows of PXa and PXb are sequentially turned off in one direction, for example, the second direction DR2 shown in FIG. 1 through FIG. 3, or an opposite direction. The pixel row means a row in which pixels are arranged substantially in the first direction DR1 and a pixel column means a column in which pixels are arranged substantially in the second direction DR2, which is applied throughout the present specification.

In the period (on) in which the optical element 500 is operated, light output by the optical element 500 or light input to the optical element 500 may pass through the second display area DA2, and the emission control signal (BL) may be synchronized with operation timing of the optical element 500 as shown in FIG. 9. That is, when the optical element 500 is operated (i.e., on), the emission control signal (BL) is at the high level, so the eighth transistor T8 is turned off, and the second pixels (PXb) including the eighth transistor T8 are turned off, and when the optical element 500 is not operated (i.e., off), the emission control signal (BL) is at the low level, so the eighth transistor T8 is turned on, and the second pixels (PXb) including the eighth transistor T8 may display images. Each period in which the emission control signal (BL) is at the high level may be less than substantially 1/20 of one frame.

A time for the emission control signal (BL) to become a high level may correspond to the time when the optical element 500 starts its operation (on) as shown in FIG. 9, e.g., before the optical element 500 starts its operation (on) by a predetermined time (t1) as shown in FIG. 10. A time for the emission control signal (BL) to become a low level may correspond to the time when the optical element 500 stops its operation (i.e., off) as shown in FIG. 9, e.g., after the optical element 500 stops its operation (i.e., off) by a predetermined time (t2) as shown in FIG. 10.

According to the above-noted description, the second pixel (PXb) provided in the second display area DA2 corresponded by the optical element 500 may be turned off and may maintain a non-emission state when the optical element 500 is operated (i.e., on). Therefore, interference between light emitted by the second pixel (PXb) and light output from or input to the optical element 500 is not generated, such that influence on the operation of the optical element 500 by light emitted by the second pixel (PXb) may be prevented. An accurate result of the optical element 500, for example, an accurate sensing result, may thereby be obtained, thereby improving a function performed by the optical element 500. Quality of the image displayed by the second display area DA2 may also be increased.

As shown in FIG. 10, when the time at which the emission control signal (BL) becomes a high level is provided before the optical element 500 starts operating (i.e., on) to turn off the eighth transistor T8 before the optical element 500 starts operating (i.e., on), influence of light of an afterimage of the pixel (PXb) on an operation of the optical element 500 when the afterimage remains in the second display area DA2 may be reduced or prevented. In a like manner, when the time at which the emission control signal (BL) becomes a low level after the optical element 500 stops operating (i.e., off) and the eighth transistor T8 is turned on after the optical element 500 completely stops operating (i.e., off), interference of light input to or output from the optical element 500 and light of the image of the second pixel (PXb) may be reduced or prevented.

FIG. 9 and FIG. 10 show that an optical element 500 is intermittently operated (i.e., on) twice for one frame, and an emission control signal (BL) has two high level periods that are separated from each other. For example, the optical element 500 may be operated once or at least three times (i.e., on) for one frame, and the emission control signal (BL) may have high level periods separated from each other once or at least three times for one frame. In another implementation, the optical element 500 may be operated (i.e., on) once for a plurality of frames and the emission control signal (BL) may include a high level period once for a plurality of frames.

Figure 11:
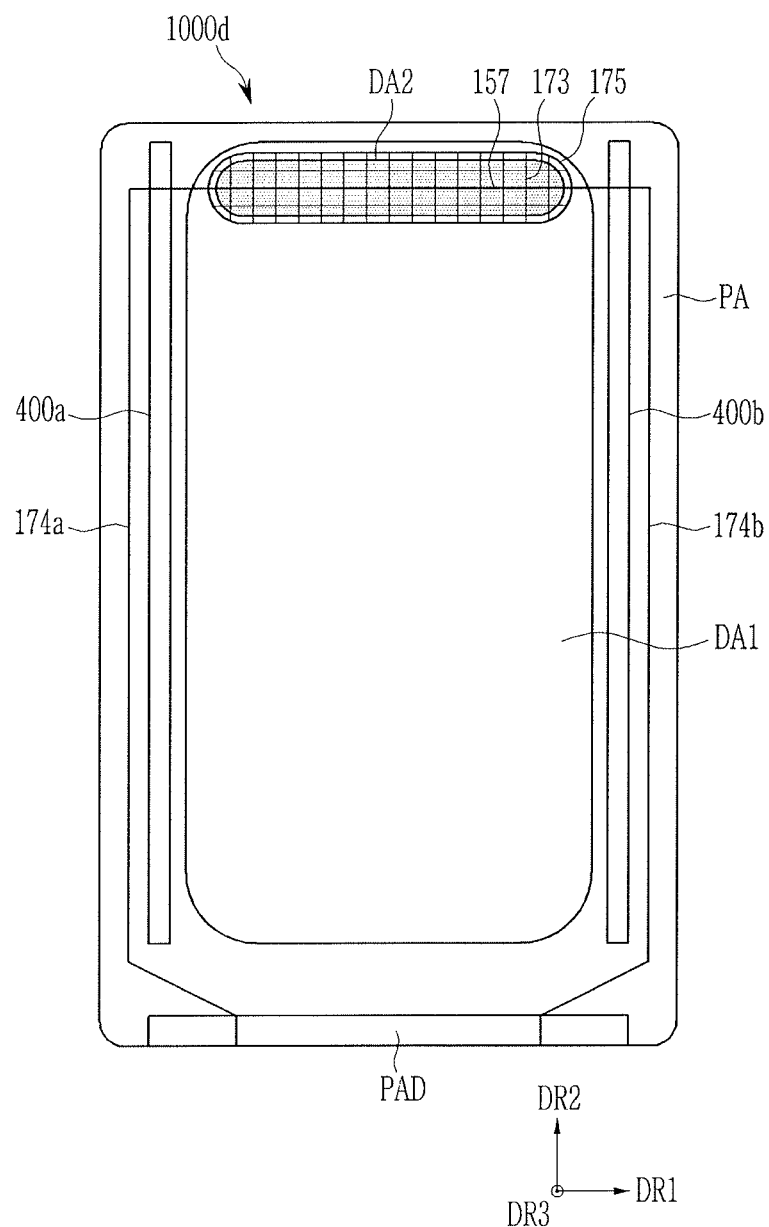
FIG. 11 illustrates a layout view of a display area of a display device according to an exemplary embodiment.

FIG. 11 shows a layout view of a display area of a display device according to an exemplary embodiment. Referring to FIG. 11, the display device 1000d mostly corresponds to the exemplary embodiment described with reference to FIG. 1 through FIG. 3, may further include signal wires 174a and 174b connected to the emission control signal line 157, and a vertical control signal line 173.

In detail, the display device 1000d may further include a peripheral area (PA) provided outside the first and second display areas DA1 and DA2, and a pad region (PAD) in which a plurality of pads are provided may be provided in the peripheral area (PA) of one edge of the display device 1000d. Scan drivers 400a and 400b connected to a plurality of scan lines 151, 152, and 154 and sequentially transmitting scan signals may be provided on the right and left of the first and second display areas DA1 and DA2. One of the scan drivers 400a and 400b may be omitted.

The emission control signal line 157 and the vertical control signal line 173 may be provided in the second display area DA2. The emission control signal line 157 and the vertical control signal line 173 may be electrically connected to each other to form a matrix in a plane, and may transmit an emission control signal (BL) to a plurality of second pixels (PXb). The emission control signal line 157 and the vertical control signal line 173 may be provided on different conductive layers in a cross-sectional view.

A peripheral control signal line 175 electrically connected to the emission control signal line 157 and the vertical control signal line 173 and transmitting an emission control signal (BL) may be further included around the second display area DA2. The peripheral control signal line 175 may extend along a peripheral edge of the second display area DA2, and its shape is not limited thereto.

The signal wires 174a and 174b may be connected to the pad region (PAD) to receive an emission control signal (BL) and transmit the same. The signal wires 174a and 174b may be electrically connected to the peripheral control signal line 175 to transmit the emission control signal (BL) to the peripheral control signal line 175. The signal wires 174a and 174b may include a portion starting at the pad region (PAD) and extending in a second direction DR2 in the peripheral area (PA) provided on the respective sides of the first and second display areas DA1 and DA2. This is an exemplary embodiment in which the second display area DA2 is provided on an opposite side of the pad region (PAD) with respect to the first and second display areas DA1 and DA2, and in other cases, the signal wires 174a and 174b may have different forms.

The signal wires 174a and 174b may be provided in the same conductive layer as the peripheral control signal line 175, the emission control signal line 157, or the vertical control signal line 173, or on a different conductive layer therefrom. For example, the signal wires 174a and 174b may be provided on a third conductive layer or a second conductive layer.

One of the two signal wires 174a and 174b provided on the respective sides with respect to the first and second display areas DA1 and DA2 may be omitted. When the peripheral control signal line 175 is omitted, the signal wires 174a and 174b may be electrically connected to the emission control signal line 157 or the vertical control signal line 173 around the edge of the second display area DA2.

A detailed configuration of a display area of a display device according to an exemplary embodiment will now be described with reference to the above-shown drawings and FIG. 12 through FIG. 15. For ease of description, a configuration of a first display area DA1 will be described with reference to FIG. 12 and FIG. 13, and a configuration of a second display area DA2 will be described with reference to FIG. 14, and FIG. 15.

Figure 12:
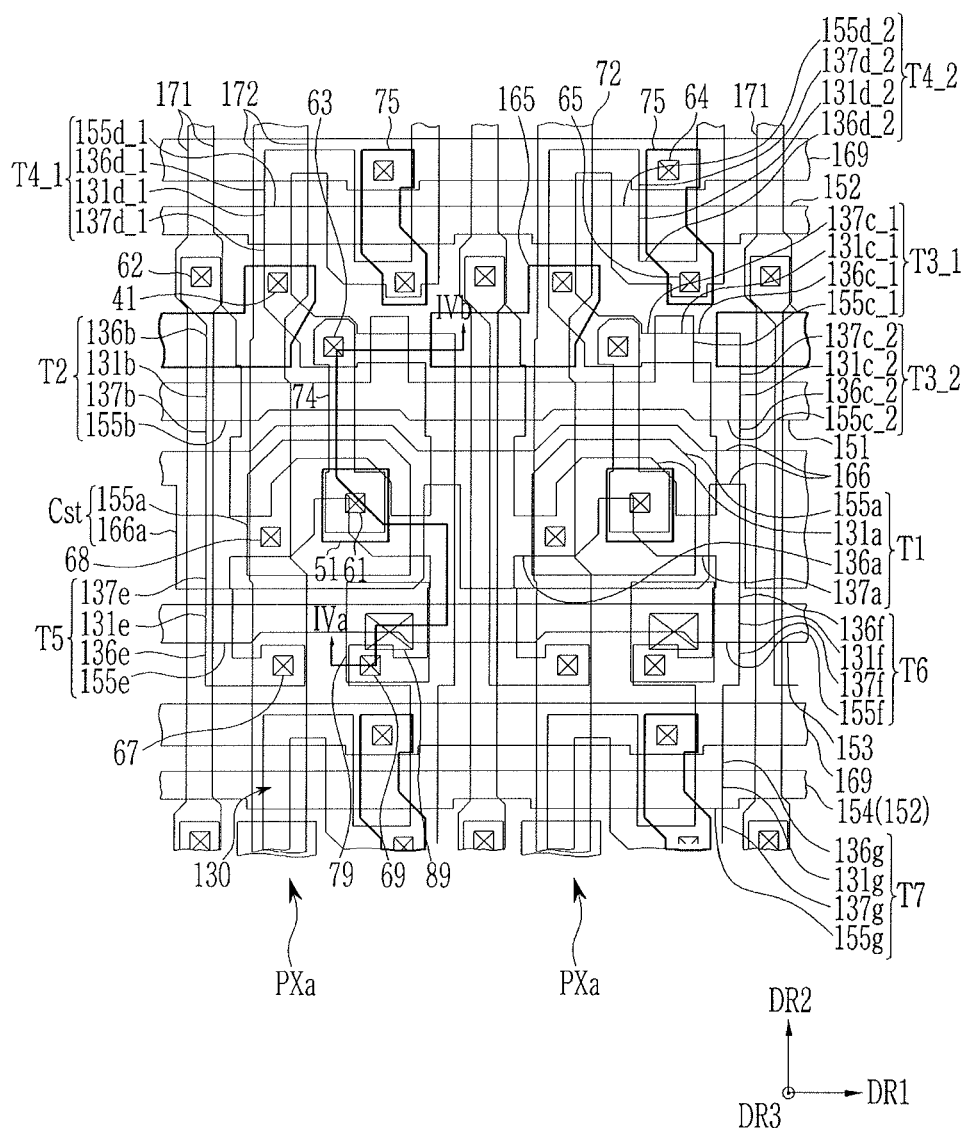
FIG. 12 illustrates a planar layout view on two neighboring pixels provided in a first display area of a display device according to an exemplary embodiment.
Figure 13:
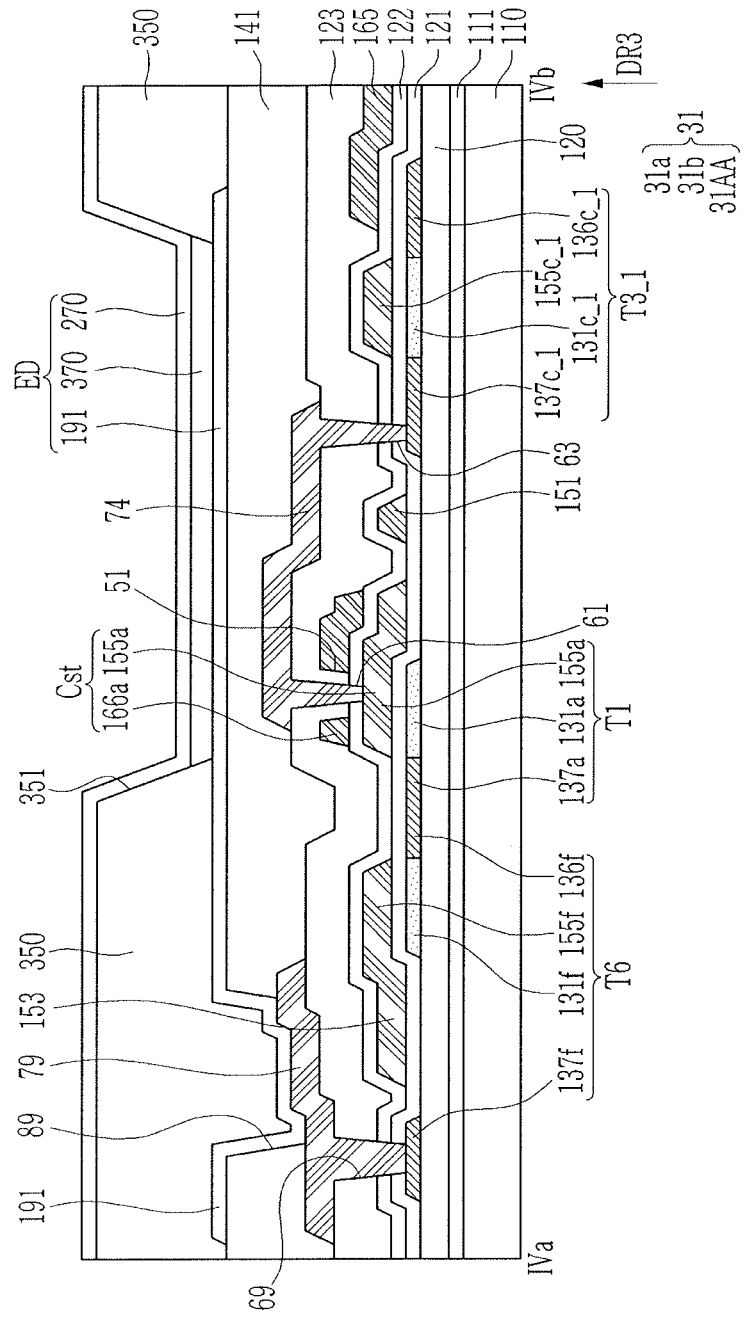
FIG. 13 illustrates a cross-sectional view of a display device with respect to a line IVa-IVb according to an exemplary embodiment shown in FIG. 12.
Figure 14:
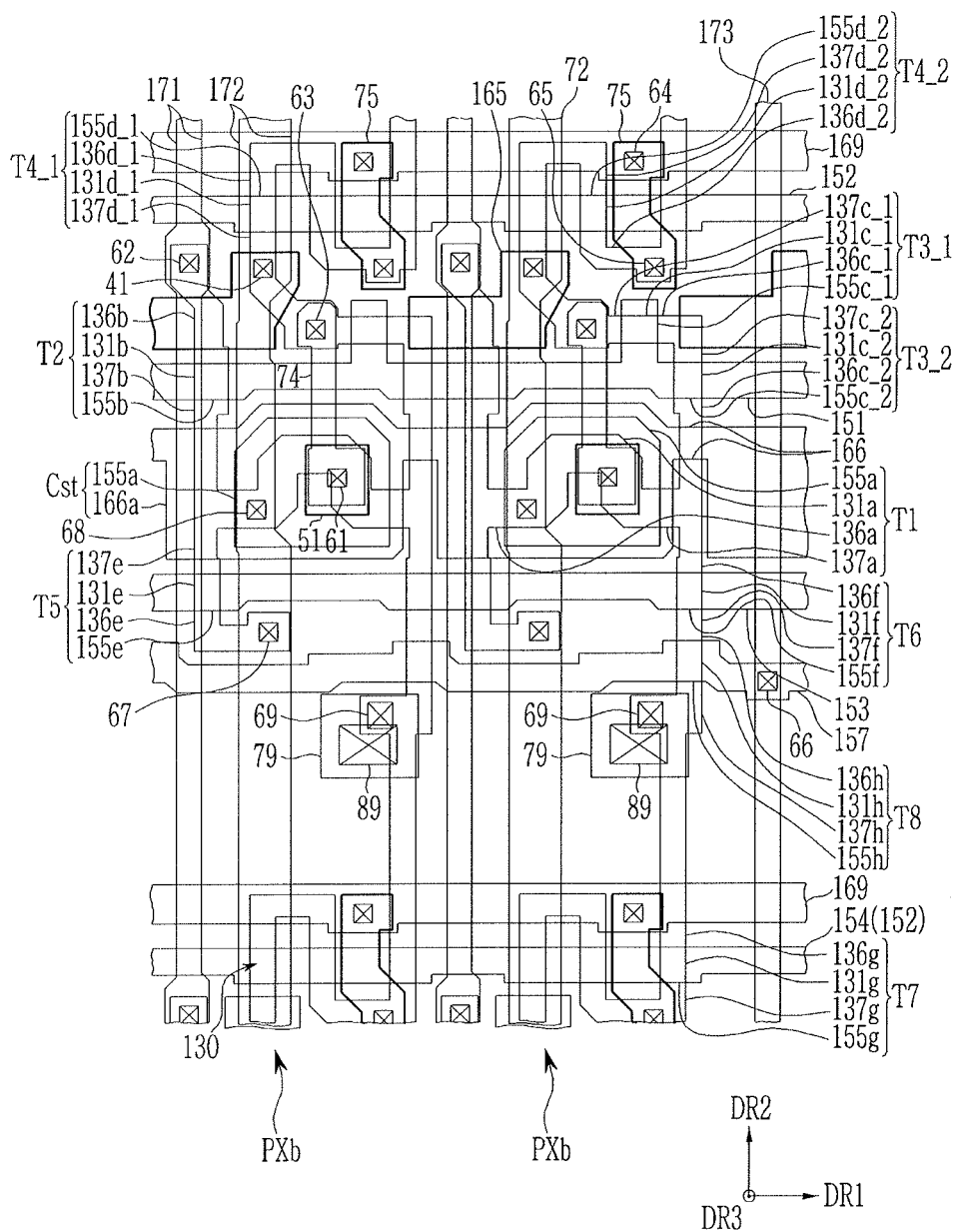
FIG. 14 illustrates a planar layout view of two neighboring pixels provided in a second display area of a display device according to an exemplary embodiment.
Figure 15:
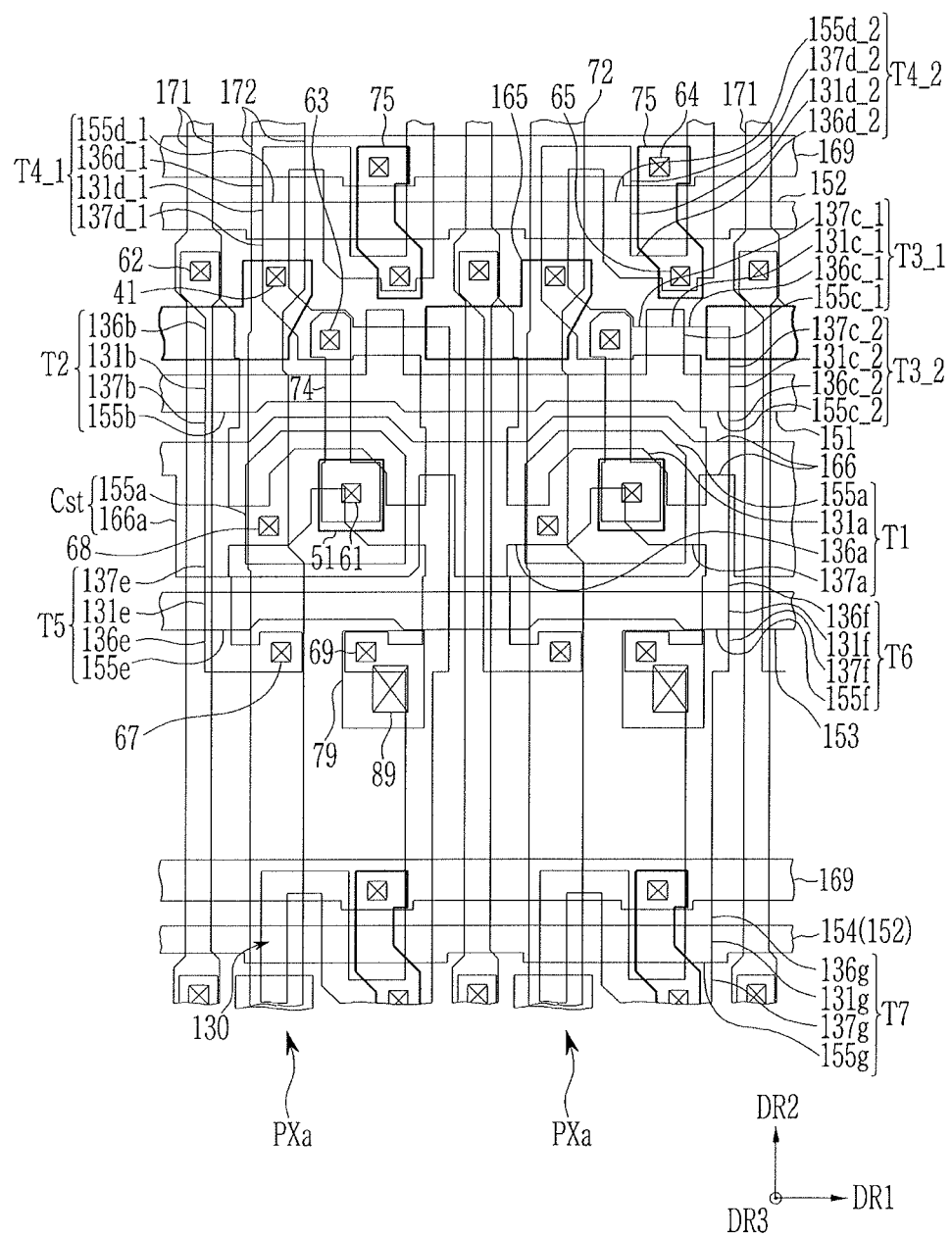
FIG. 15 illustrates a planar layout view of two neighboring pixels provided in a first display area of a display device according to an exemplary embodiment.

FIG. 12 shows a planar layout view on two neighboring first pixels PXa provided in a first display area DA1 of a display device according to an exemplary embodiment, FIG. 13 shows a cross-sectional view of a display device with respect to a line IVa-IVb according to an exemplary embodiment shown in FIG. 12, FIG. 14 shows a planar layout view of two neighboring second pixels PXb provided in a second display area DA2 of a display device according to an exemplary embodiment, and FIG. 15 shows a planar layout view of two neighboring first pixels PXa provided in a first display area DA1 of a display device according to an exemplary embodiment.

FIG. 12 shows two first pixels (PXa) with a same configuration neighboring each other in the first direction DR1, and for convenience of illustration, reference numerals of constituent elements on the right portion of the left first pixel (PXa) are denoted at a right portion of the right first pixel (PXa).

Referring to FIG. 12 and FIG. 13, a barrier layer 111 that is an insulating layer may be provided on a substrate 110, and a buffer layer 120 that is an insulating layer may be provided on the barrier layer 111. At least one of the barrier layer 111 and the buffer layer 120 may be omitted.

An active pattern 130 is on the buffer layer 120. The active pattern 130 may include channel regions 131a, 131b, 131c_1, 131c_2, 131d_1, 131d_2, 131e, 131f, and 131g for generating channels of a plurality of transistors T1, T2, T3_1, T3_2, T4_1, T4_2, T5, T6, and T7, and a conductive region. The conductive region of the active pattern 130 may include source regions 136a, 136b, 136c_1, 136c_2, 136d_1, 136d_2, 136e, 136f, and 136g and drain regions 137a, 137b, 137c_1, 137c_2, 137d_1, 137d_2, 137e, 137f, and 137g of the transistors T1, T2, T3_1, T3_2, T4_1, T4_2, T5, T6, and T7. The source region and the drain region are terms for distinguishing the conductive regions provided on the respective sides with respect to the channel regions 131a, 131b, 131c_1, 131c_2, 131d_1, 131d_2, 131e, 131f, and 131g, and are interchangeable. The active pattern 130 may include amorphous silicon, polysilicon, or an oxide semiconductor.

A first insulating layer 121 may be provided on the active pattern 130, and a first conductive layer may be provided on the first insulating layer 121. The first conductive layer may include the above-described scan lines 151, 152, and 154, the control line 153, and a driving gate electrode 155a. The scan lines 151, 152, and 154 and the control line 153 may substantially extend in the first direction DR1.

A second insulating layer 122 may be provided on the first conductive layer and the first insulating layer 121, and a second conductive layer may be provided on the second insulating layer 122. The second conductive layer may include a storage line 166 and an initialization voltage line 169 for transmitting an initialization voltage. The storage line 166 may include an extension 166a overlapping the driving gate electrode 155a.

The second conductive layer may further include a shield pattern 165. The shield pattern 165 may be provided between the scan line 151 and the scan line 152.

A third insulating layer 123 may be provided on the second conductive layer and the second insulating layer 122. At least one of the barrier layer 111, the buffer layer 120, the first insulating layer 121, the second insulating layer 122, and the third insulating layer 123 may include an inorganic insulating material and/or an organic insulating material such as a silicon oxide, a silicon nitride, a silicon oxynitride, or an aluminum oxide. Some or all of the first insulating layer 121, the second insulating layer 122, and the third insulating layer 123 may include a plurality of contact holes 41, 61, 62, 63, 64, 65, 67, 68, and 69.

A third conductive layer may be provided on the third insulating layer 123. The third conductive layer may include a plurality of connecting members 74, 75, and 79, a data line 171, and a driving voltage line 172 connected to source regions 136a, 136b, 136c_1, 136c_2, 136d_1, 136d_2, 136e, 136f, and 136g or drain regions 137a, 137b, 137c_1, 137c_2, 137d_1, 137d_2, 137e, and 137f, 137g of the active pattern 130.

The data line 171 and the driving voltage line 172 may extend in the second direction DR2, and may traverse a plurality of scan lines 151, 152, and 154. An extension 166a of the storage line 166 may be connected to the driving voltage line 172 through the contact hole 68 and may receive a driving voltage (ELVDD).

The driving voltage line 172 may be electrically connected to the shield pattern 165 through the contact hole 41 and may transmit a driving voltage (ELVDD) to the shield pattern 165. The shield pattern 165 may shield the connecting member 74 that is a driving gate node (GN) and the data line 171 to prevent a change of voltage of the driving gate node (GN) caused by a change of the data signal. The shield pattern 165 may be omitted.

The first transistor T1 includes a channel region 131a, a source region 136a, a drain region 137a, and a driving gate electrode 155a. The driving gate electrode 155a may be connected to the connecting member 74 through a contact hole 61. The contact hole 61 may be provided in a hole 51 included by the extension 166a.

The second transistor T2 includes a channel region 131b, a source region 136b, a drain region 137b, and a gate electrode 155b that is part of the scan line 151. The source region 136b is connected to the data line 171 through the contact hole 62, and the drain region 137b is connected to the source region 136a through the first transistor T1.

The third transistors T3_1 and T3_2 may include an upper third transistor T3_1 and a lower third transistor T3_2 connected to each other. The upper third transistor T3_1 includes a channel region 131c_1, a source region 136c_1, a drain region 137c_1, and a gate electrode 155c_1 that is part of the scan line 151. The drain region 137c_1 is connected to the connecting member 74 through a contact hole 63. The lower third transistor T3_2 includes a channel region 131c_2, a source region 136c_2, a drain region 137c_2, and a gate electrode 155c_2 that is part of the scan line 151.

The fourth transistors T4_1 and T4_2 may include a left fourth transistor T4_1 and a right fourth transistor T4_2 connected to each other. The left fourth transistor T4_1 includes a channel region 131d_1, a source region 136d_1, a drain region 137d_1, and a gate electrode 155d_1 that is part of the scan line 152. The drain region 137d_1 is connected to the drain region 137c_1 of the upper third transistor T3_1 and to the connecting member 74 through the contact hole 63. The right fourth transistor T4_2 includes a channel region 131d_2, a source region 136d_2, a drain region 137d_2, and a gate electrode 155d_2 that is part of the scan line 152. The drain region 137d_2 is connected to the source region 136d_1 of the left fourth transistor T4_1 and the source region 136d_2 is connected to the connecting member 75 through a contact hole 65. The connecting member 75 may be electrically connected to the initialization voltage line 169 through the contact hole 64.

The fifth transistor T5 includes a channel region 131e, a source region 136e, a drain region 137e, and a gate electrode 155e that is part of the control line 153. The source region 136e is electrically connected to the driving voltage line 172 through the contact hole 67, and the drain region 137e is connected to the source region 136a of the first transistor T1.

The sixth transistor T6 includes a channel region 131f, a source region 136f, a drain region 137f, and a gate electrode 155f that is part of the control line 153. The source region 136f is connected to the drain region 137a of the first transistor T1, and the drain region 137f is connected to the connecting member 79 through a contact hole 69.

The seventh transistor T7 includes a channel region 131g, a source region 136g, a drain region 137g, and a gate electrode 155g that is part of the scan line 154. The source region 136g may be connected to the drain region 137f of the sixth transistor T6, and the drain region 137g may be connected to the connecting member 75 through the contact hole 65 to receive an initialization voltage.

The capacitor Cst included by one first pixel (PXa) may include a driving gate electrode 155a and an extension 166a of the storage line 166 overlapping each other with a second insulating layer 122 therebetween as two terminals.

At least one of the first conductive layer, the second conductive layer, and the third conductive layer may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), alloys thereof, and the like.

A fourth insulating layer 141 may be provided on the third conductive layer. The fourth insulating layer 141 may include an inorganic insulating material and/or an organic insulating material, e.g., a polyimide, an acryl-based polymer, or a siloxane-based polymer.

A pixel electrode layer as a fourth conductive layer may be provided on the fourth insulating layer 141. The pixel electrode layer may include a pixel electrode 191 provided on the first pixel (PXa). The pixel electrode 191 may be connected to the connecting member 79 through a contact hole 89 of the fourth insulating layer 141 to receive a data voltage.

A fifth insulating layer (350, pixel defining layer) may be provided on the fourth insulating layer 141. The fifth insulating layer 350 may include an opening 351 provided in the pixel electrode 191. The fifth insulating layer 350 may include an organic insulating material such as a polyacryl-based resin or a polyimide-based resin.

An emission layer 370 is provided on the pixel electrode 191. The emission layer 370 may include a portion provided in the opening 351 of the fifth insulating layer 350. The emission layer 370 may include an organic emitting material or an inorganic emitting material.

A common electrode 270 may be provided on the emission layer 370. The common electrode 270 may be formed on a fifth insulating layer 350 and may be continuously formed over a plurality of first pixels (PXa). The common electrode 270 may be formed as a continuous electrode in the first display area DA1 and the second display area DA2. The common electrode 270 may include a conductive transparent material.

A pixel electrode 191 of the first pixel (PXa), an emission layer 370, and a common electrode 270 configure a light emitting diode (ED), and one of the pixel electrode 191 and the common electrode 270 becomes a cathode while the other thereof becomes an anode.

Referring to FIG. 12, FIG. 13, and FIG. 14, the configuration of the second display area DA2 mostly corresponds to the configuration of the first display area DA1, except the second display area DA2 may further include an eighth transistor T8, an emission control signal line 157, and a vertical control signal line 173. FIG. 14 illustrates the configuration that corresponds to the exemplary embodiment described with reference to FIG. 6 among the exemplary embodiments described with reference to FIG. 6 through FIG. 8.

The emission control signal line 157 may be provided on the first conductive layer and may extend substantially in the first direction DR1 in a plane view. The emission control signal line 157 may be provided between the control line 153 and the scan line 154 in a plane view. One emission control signal line 157 may be provided for each pixel row in the second display area DA2.

The vertical control signal line 173 may be provided on the emission control signal line 157 and another conductive layer, for example, the third conductive layer, and it may extend substantially in the second direction DR2 in a plane view to traverse the emission control signal line 157 and the scan lines 151, 152, and 154. One vertical control signal line 173 may be provided for each group of a plurality of pixel rows in the second display area DA2. For example, one vertical control signal line 173 may be provided for each group of three pixel rows. In an implementation, one vertical control signal line 173 may be provided for each pixel row.

The vertical control signal line 173 may be electrically connected to the emission control signal line 157 through contact holes 66 included in the second insulating layer 122 and the third insulating layer 123 in a traversing region with the emission control signal line 157. The contact hole 66 may overlap a traversing region of the emission control signal line 157 and the vertical control signal line 173. Differing from this, the vertical control signal line 173 and the emission control signal line 157 may be electrically connected to each other through a conductor provided on a conductive layer that is different from the first conductive layer and the third conductive layer.

An active pattern 130 traversing the control line 153 and forming the channel region 131f of the sixth transistor T6 may extend downward and include a portion traversing the emission control signal line 157.

The eighth transistor T8 includes a channel region 131h, a source region 136h, a drain region 137h, and a gate electrode 155h that is part of the emission control signal line 157. The source region 136h may be connected to the drain region 137f of the sixth transistor T6, and the drain region 137h may be connected to the connecting member 79 through a contact hole 69. A source region 136g of the seventh transistor T7 is connected to the drain region 137h of the eighth transistor T8.

Referring to FIG. 12 and FIG. 14, a pitch in the second direction DR2 of the second pixels (PXb) in the second display area DA2 according to an exemplary embodiment may be greater than a pitch in the second direction DR2 of the first pixels (PXa) in the first display area DA1. Here, the pitch in the second direction DR2 of the pixel indicates a distance between two patterns repeated in the second direction DR2, e.g., calculated as a distance between a portion of an initialization voltage line 169 provided upward and a portion of the initialization voltage line 169 provided downward. A distance in the second direction DR2 between the control line 153 and the initialization voltage line 169 in the second display area DA2 may be farther than a distance in the second direction DR2 between the control line 153 and the initialization voltage line 169 in the first display area DA1.

In an implementation, referring to FIG. 14 and FIG. 15, the pitch in the second direction DR2 of the second pixels (PXb) in the second display area DA2 may be equivalent or similar to the pitch in the second direction DR2 of the first pixels (PXa) in the first display area DA1. In this case, the distance in the second direction DR2 between the control line 153 and the initialization voltage line 169 in the second display area DA2 may be equivalent or similar to the distance in the second direction DR2 between the control line 153 and the initialization voltage line 169 in the first display area DA1.

Figure 16:
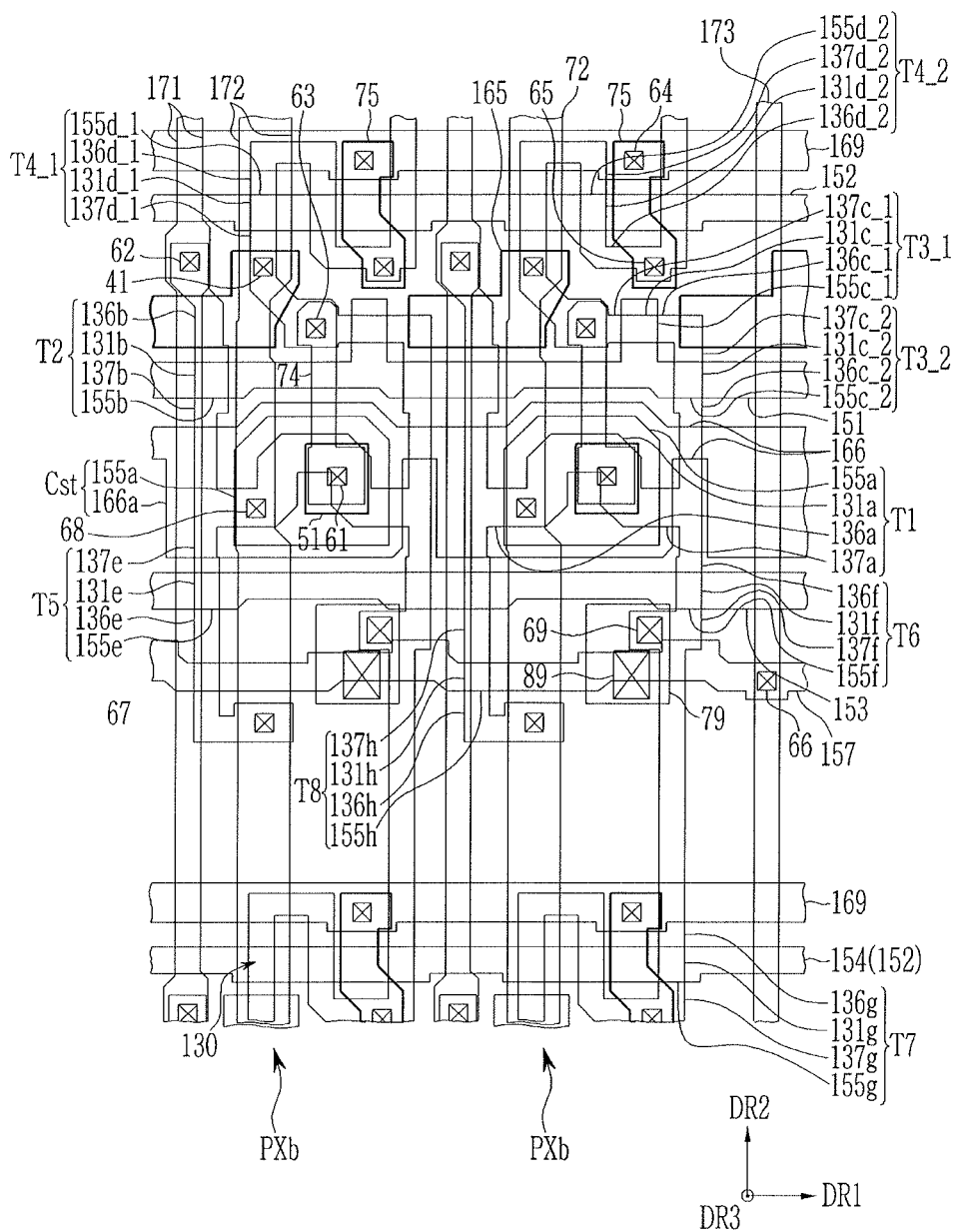
FIG. 16 illustrates a planar layout view of two neighboring pixels provided in a second display area of a display device according to an exemplary embodiment.

A second display area DA2 of a display device according to an exemplary embodiment will now be described with reference to FIG. 16. FIG. 16 shows a planar layout view of two neighboring second pixels (PXb) provided in a second display area DA2 of a display device according to an exemplary embodiment.

Referring to FIG. 16, a second display area DA2 of the display device according to the present exemplary embodiment mostly corresponds to a second display area DA2 of the display device described with reference to FIG. 14, except the eighth transistor T8 is at a different position. FIG. 16 illustrates the configuration that corresponds to the exemplary embodiment described with reference to FIG. 7 among the exemplary embodiments described with reference to FIG. 6 through FIG. 8.

The active pattern 130 traversing the control line 153 and forming the channel region 131e of the fifth transistor T5 may extend downward and include a portion traversing the emission control signal line 157.

The eighth transistor T8 includes a channel region 131h, a source region 136h, a drain region 137h, and a gate electrode 155h that is part of the emission control signal line 157. The source region 136h may be electrically connected to the driving voltage line 172 through the contact hole 67, and the drain region 137h may be connected to the source region 136e of the fifth transistor T5.

According to another exemplary embodiment, the pixels included by the first and second display areas DA1 and DA2 included by one display device may have the same configuration as the second pixel (PXb) including the eighth transistor T8 connected to the emission control signal line 157 in a like manner of the above-described exemplary embodiments.

By way of summation and review, one or more embodiments provide a display device with functions including image displaying and another function performed by an optical element that improves the another function performed by the optical element by reducing or preventing interference of the display function with the another function.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a scan line, the scan fine for transmitting a scan signal;
   a control line for transmitting a control signal that is different from the scan signal;
   an emission control signal line for transmitting an emission control signal that is different from the control signal;
   a data line and a driving voltage line traversing the scan line and the control line;
   a first transistor including a first gate electrode, a first channel region, a first source region, and a first drain region;
   a second transistor including a second gate electrode connected to the scan line, a second source region connected to the data line, and a second drain region connected to the first source region;
   a light-emitting element;
   a control transistor including a control gate electrode connected to the control line, connected between the driving voltage line and the first source region; and
   an emission control transistor including an emission control gate electrode connected to the emission control signal line, and connected between the driving voltage line and the first source region, wherein
   the control transistor is directly connected to the emission control transistor, and
   at least one of the control transistor and the emission control transistor is directly connected to the first source region.

2. The display device as claimed in claim 1, wherein:
   the control transistor includes a control drain region connected to the first source region, and a control source region, and
   the emission control transistor includes an emission control drain region connected to the control source region, and an emission control source region connected to the driving voltage line.

3. The display device as claimed in claim 1, wherein:
   the control transistor includes a control source region connected to the driving voltage line, and a control drain region, and the emission control transistor includes an emission control source region connected to the control drain region, and an emission control drain region connected to the first source region.

4. The display device as claimed in claim 1, further comprising:
a third transistor including a third drain region connected to the light-emitting element, and a third source region connected to the first drain region.

5. The display device as claimed in claim 1, further comprising:
a fourth transistor including a fourth gate electrode connected to the scan line, a fourth drain region connected to the first gate electrode, and a fourth source region connected to the first drain region; and
a capacitor including a first terminal connected to the first gate electrode, and a second terminal connected to the driving voltage line.

6. The display device as claimed in claim 1, further comprising a vertical control signal line traversing the emission control signal line and electrically connected to the emission control signal line.

7. A display device, comprising:
a substrate that includes a first surface and a second surface opposing each other, the substrate further including a display area;
a scan line disposed on the first surface of the substrate, the scan line for transmitting a scan signal;
a control line for transmitting a control signal that is different from the scan signal;
an emission control signal line for transmitting an emission control signal that is different from the control signal;
a data line and a driving voltage line traversing the scan line and the control line;
a first transistor including a first gate electrode, a first channel region, a first source region, and a first drain region;
a second transistor including a second gate electrode connected to the scan line, a second source region connected to the data line, and a second drain region connected to the first source region;
a light-emitting element;
a control transistor including a control gate electrode connected to the control line, and connected between the driving voltage line and the first source region;
an emission control transistor including an emission control gate electrode connected to the emission control signal line, and connected between the driving voltage line and the first source region; and
an optical element disposed below the second surface of the substrate, wherein
the control transistor is directly connected to the emission control transistor, and
at least one of the control transistor and the emission control transistor is directly connected to the first source region.

8. The display device as claimed in claim 7, wherein the optical element includes a camera or a sensor.

9. The display device as claimed in claim 7, further comprising:
a peripheral area provided outside the display area; and
a signal wire provided in the peripheral area, electrically connected to the emission control signal line, and for transmitting the emission control signal.

10. The display device as claimed in claim 9, further comprising a vertical control signal line traversing the emission control signal line, and electrically connected to the emission control signal line.

11. The display device as claimed in claim 10, further comprising a peripheral control signal line electrically connected to the emission control signal line and the vertical control signal line.

12. The display device as claimed in claim 7, wherein the scan line, the control line, and the emission control signal line are provided in a same conductive layer.

* * * * *